United States Patent [19]

Hoffman

[11] Patent Number: 4,682,151

[45] Date of Patent: Jul. 21, 1987

[54] POSITION TO DUTY CYCLE CONVERSION APPARATUS AND METHOD

[75] Inventor: John P. Hoffman, Peoria, Ill.

[73] Assignee: Caterpillar Inc., Peoria, Ill.

[21] Appl. No.: 804,555

[22] Filed: Dec. 4, 1985

[51] Int. Cl.[4] .............................................. H03M 1/00

[52] U.S. Cl. ................................ 340/347 SY; 318/661

[58] Field of Search ................. 340/347 SY; 318/661; 364/816

[56] References Cited

U.S. PATENT DOCUMENTS

| | | | |
|---|---|---|---|
| 3,226,710 | 12/1965 | Tripp | 340/347 SY |
| 3,639,850 | 2/1972 | Brooks | 329/50 |
| 3,676,650 | 7/1972 | Henegar | 340/347 SY |
| 3,828,331 | 8/1974 | Brooks | 340/179 |
| 3,922,671 | 11/1975 | Tripp | 340/347 SY |
| 4,321,684 | 3/1982 | Sommeria | 318/661 |

FOREIGN PATENT DOCUMENTS 1155334 6/1969 United Kingdom .

*Primary Examiner*—Charles D. Miller
*Attorney, Agent, or Firm*—Stephen L. Noe

[57] ABSTRACT

Resolvers are in common use as angular position sensing devices. Such resolvers normally require difficult to generate sine-wave excitation signals, and extensive decoding circuitry for producing an output signal related to angular position. The subject apparatus utilizes a generator to produce a rectangular-wave timing signal. A logic circuit receives the timing signal and responsively produces first and second rectangular-wave excitation signals, which are delivered to respective stator coils of a resolver. A decoding circuit receives one of the excitation signals and the phase encoded signal magnetically induced in the rotor coil of the resolver, and produces an angular position signal having a duty cycle responsive to the phase difference between the received signals.

2 Claims, 2 Drawing Figures

POSITION TO DUTY CYCLE CONVERSION APPARATUS AND METHOD

DESCRIPTION

TECHNICAL FIELD

This invention relates generally to an apparatus and method for producing a duty cycle signal in response to mechanical motion, and more particularly, to an apparatus and method for producing an electrical signal having a duty cycle that varies in response to the angular position of a rotatable shaft.

BACKGROUND ART

Owing to the ever increasing use of digital electronic circuits, and the various control options made possible by the availability of such circuits, it is becoming increasingly necessary to provide suitable transducers that operate in the digital domain. For example, induction resolvers have long been used in industry for translating mechanical angular position into a responsive analog signal. The analog signal is typically a phase encoded sine-wave signal produced by transformer action in one or more coils of the resolver. Such resolvers are capable of high resolution of angular position. However, the resultant phase encoded sine-wave signal is unsuitable for direct use in digital circuits. Therefore, some form of phase-to-digital conversion has necessarily been employed.

One example of a phase-to-duty cycle conversion apparatus is disclosed in U.S. Pat. No. 3,639,850, issued Feb. 1, 1972, to Herman H. Brooks. Brooks discloses circuitry for squaring the phase encoded sine-wave signal delivered from a conventional resolver, comparing the squared signal with a similarly squared reference signal, and responsively producing a duty cycle signal. Similar circuitry is shown in a subsequent patent, U.S. Pat. No. 3,828,331, also issued to Brooks on Aug. 6, 1974.

While both of these patents do disclose the provision of a duty cycle signal responsive to the angular position of a resolver, they, in accord with other known art, suffer the disadvantage of requiring that the resolver be excited with sine-wave signals. As those skilled in the art are aware, the generation of precision sine-wave signals is relatively complicated. The situation is further complicated when a resolver having multiple stator coils, each requiring a phase shifted excitation signal, is employed. In the case of a dual stator resolver, both sine and cosine excitation signals must be produced. The circuitry required merely to produce the excitation signals is complex and expensive, as is the circuitry subsequently required for decoding or demodulating the signals.

The present invention is directed to overcoming one or more of the problems as set forth above.

DISCLOSURE OF THE INVENTION

In one aspect of the present invention, an apparatus for producing an electrical signal having a duty cycle that varies in response to the angular position of a rotatable shaft is provided. The apparatus includes a resolver having the shaft rotatably mounted in a frame. The resolver includes a rotor coil connected to the shaft and first and second stator coils mounted on the frame and positioned about the rotor coil. A generator produces a rectangular-wave timing signal, and a logic circuit receives the timing signal and responsively produces first and second rectangular-wave excitation signals. The first and second excitation signals are delivered to respective ones of the first and second stator coils. A decoding circuit receives the phase encoded signal induced in the rotor coil in response to the excitation signals, compares the phase encoded signal with one of the excitation signals, and produces a duty cycle encoded position signal.

In a second aspect of the present invention, a method for producing an electrical signal having a duty cycle that varies in response to the angular position of a rotatable resolver shaft is provided. A resolver has a frame in which the resolver shaft is rotatably mounted, a rotor coil connected to the shaft, and first and second stator coils mounted on the frame and positioned about the rotor coil. The method includes the steps of producing a rectangular-wave timing signal and first and second rectangular-wave excitation signals. The excitation signals are delivered to respective ones of the first and second stator coils. The phase encoded signal that is induced in the rotor coil in response to the excitation signals is received and decoded. The decoded signal is compared with one of the excitation signals and a position signal having a duty cycle responsive to the phase difference between the compared signals is produced.

The present invention provides a digitally compatible duty cycle position signal utilizing a conventional resolver as a sensing device. The resolver advantageously employs easily generated rectangular-wave signals for excitation, and requires no sine-wave signal generation.

BRIEF DESCRIPTION OF THE DRAWINGS

For a better understanding of the present invention, reference may be made to the accompanying drawings, in which.

BEST MODE FOR CARRYING OUT THE INVENTION

Figure 1:
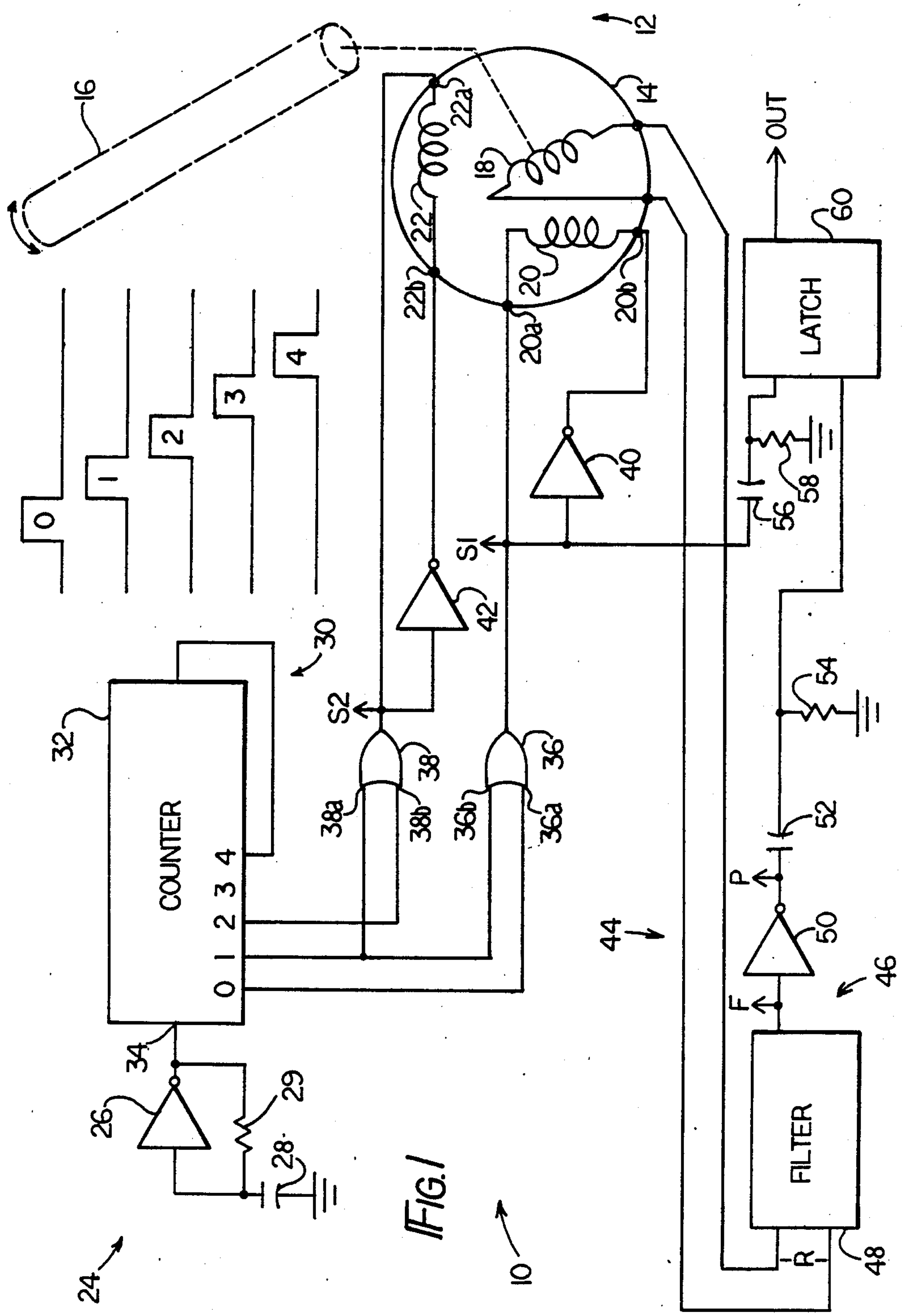
FIG. 1 is a schematic diagram of an embodiment of the present invention.

Referring now to the drawings, an apparatus embodying certain of the principles of the present invention is generally indicated by the reference numeral 10. It should be understood that the following detailed description relates to the best presently known embodiment of the apparatus 10. However, the apparatus 10 can assume numerous other embodiments, as will become apparent to those skilled in the art, without departing from the appended claims.

The apparatus 10 includes a resolver 12 having a frame 14 with a shaft 16 rotatably mounted therein. A rotor coil 18 is connected to the shaft 16, and first and second stator coils 20,22 are mounted on the frame 14 and positioned about the rotor coil 18. Each of the first and second stator coils 20,22 has respective first and second stator coil terminals *20a,20b,22a,22b*.

A generator means 24 produces a rectangular-wave timing signal. The generator means 24 is, for example, a simple multivibrator composed of a Schmidt trigger 26, a timing capacitor 28, and a feedback resistor 29. The frequency of the rectangular-wave timing signal produced by the generator means 24 is responsive to the value of the timing capacitor 28 and feedback resistor 29. If greater precision is required, a crystal based multivibrator can be incorporated in the generator means 24.

A logic means 30 receives the timing signal from the generator means 24 and responsively produces first and second rectangular-wave excitation signals. The excitation signals have a predetermined phase relationship to one another, and are delivered to respective ones of the first and second stator coils 20,22. The logic means 30 includes a counter 32 having a plurality of coded output terminals, and a count input terminal 34 connected to the generator means 24. The counter 32 is, for example, a commercially available divide-by-ten counter having ten output terminals, five of which are used in the preferred embodiment, and are labelled "0–4".

In the preferred embodiment, the counter output terminal "0" is connected to the first logic gate first input terminal 36*a* and the counter output terminal "1" is connected to the first logic gate second input terminal 36*b*. Correspondingly, the counter output terminal "1" is also connected to the second logic gate first input terminal 38*a*, and the counter output terminal "2" is connected to the second logic gate second input terminal 38*b*. Finally, the output terminal labelled "4" is connected to a "reset" terminal of the counter 32.

The logic means 30 also includes first and second signal inverters 40,42, each having an input terminal connected to a respective one of the first and second logic gate output terminals and an output terminal connected to a respective one of the first and second stator second coil terminals 20*b*,22*b*. In the preferred embodiment, the first signal inverter 40 has an input terminal connected to the first logic gate 36 output terminal, and an output terminal connected to the first stator coil second terminal 20*b*. Correspondingly, the second signal inverter 42 has an input terminal connected to the second logic gate 38 output terminal, and an output terminal connected to the second stator coil second terminal 22*b*.

A decoding means 44 receives the phase encoded signal, magnetically induced in the rotor coil 18 in response to the first and second rectangular-wave excitation signals. The decoding means 44 compares the phase encoded signal with one of the first and second excitation signals and produces a position signal having a duty cycle responsive to the phase difference between the compared signals.

The decoding means 44 includes filter means 46 for extracting a fundamental frequency signal from the induced phase encoded signal. The filter means 46 includes a low pass filter circuit 48 having an output terminal, and an input terminal connected across the rotor coil 18. The filter 48 is shown in block form, and can be, for example, any conventional low pass filter circuit, either active or passive. In the simplest embodiment, the filter 48 is a conventional, multi-stage R/C passive filter circuit.

The decoding means 44 also includes a signal conditioning circuit 50 having an output terminal, and an input terminal connected to the filter 48 output terminal. The signal conditioning circuit 50 can be any conventional circuit suitable for squaring an electrical signal. In the preferred embodiment, the signal conditioning circuit 50 is a simple logic inverter. The output terminal of the signal conditioning circuit 50 is connected to a first differentiation circuit composed of a capacitor 52 and resistor 54. A similar second differentiation circuit composed of a capacitor 56 and resistor 58 is connected to the output terminal of the first logic gate 36.

A latch 60, for example, a R/S flip-flop, has a first input terminal connected through the second differentiation circuit capacitor 56 to the output of the first logic gate 36, and a second input terminal connected through the first differentiation circuit capacitor 52 to the output of the signal conditioning circuit 50. The latch 60 also has an output terminal at which is provided the duty cycle output signal from the apparatus 10.

Industrial Applicability

Figure 2:
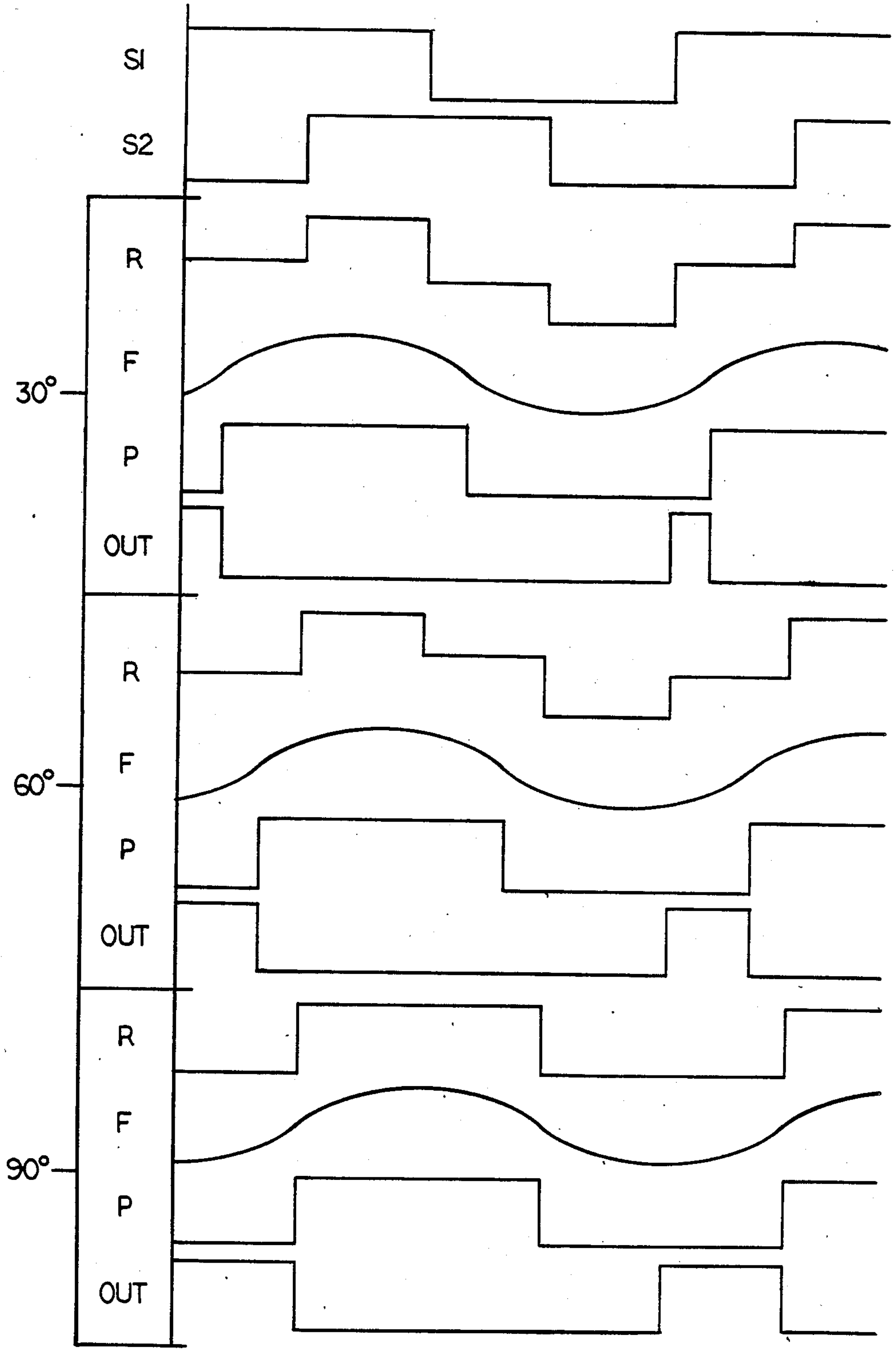
FIG. 2 is a plurality of waveforms associated with various test points indicated on FIG. 1.

Operation and use of the apparatus 10 is best understood by reference to the various signal waveforms depicted in FIG. 2 and associated with indicated test points in FIG. 1. In a typical application, the shaft 16 of the resolver 12 is linked to a mechanical device (not shown). Movement of the mechanical device causes the shaft 16 to rotate, through an appropriate linkage, within the resolver frame 14, and a duty cycle signal representing the angle of the shaft 16 position is delivered at the output terminal of the latch 60.

The generator means 24 continuously produces a rectangular-wave timing signal which is delivered to the count input terminal 34 of the counter 32. The counter 32 divides the received rectangular-wave timing signal, and responsively produces a plurality of output signals at the counter output terminals "0–4". Each pulse received from the generator means 24 causes a respective one of the counter output terminals to switch from a logic "low" state to a logic "high" state for the duration of that pulse, as shown in the waveform drawing inset in FIG. 1. Upon the receipt of every fifth pulse from the generator means 24, the counter 32 is reset by the pulse at the output terminal labelled "4" being fed back into the "reset" terminal of the counter 32.

The counter 32 output terminals "0–2" are connected to respective input terminals of the first and second logic gates 36,38. Responsively, the first and second logic gates 36,38 produce the first and second rectangular-wave excitation signals shown respectively at the test points "S1" and "S2". Owing to the particular interconnection of the logic gate input terminals 36*a*,36*b*,38*a*,38*b*, and counter output terminals "0–2", the first and second rectangular-wave excitation signals are exactly 90 degrees out of phase, one with the other.

The produced rectangular-wave excitation signals are delivered to respective ones of the stator coil first terminals 20*a*,22*a* of each of the first and second stator coils 20,22. The stator coil second terminals 20*b*,22*b* of the first and second stator coils 20,22 are also connected to the respective output terminals of the first and second logic gates 36,38. However, the connection is through respective ones of the first and second inverters 40,42. This particular circuit arrangement advantageously causes the average excitation current flowing through the stator coils 20,22 to be zero. In applications where zero average current is not necessary or advantageous, one terminal of each of the first and second stator coils 20,22 can be connected to circuit ground, and the first and second inverters 40,42 can be eliminated from the circuit. The logic devices supplying the excitation current are preferably CMOS types, capable of operating "rail-to-rail" over the full supply voltage range. Each of the first and second logic gates 36,38 and first and second inverters 40,42 can be of CMOS construction, or additional CMOS drivers can be incorporated in the stator coil circuits.

Excitation of the first and second stator coils 20,22 causes a responsive current to be magnetically induced in the rotor coil 18. The phase relationship of the signal induced in the rotor coil 18 to the first and second excitation signals is determined by the angular relationship of the rotor coil 18 to the first and second stator coils 20,22. In response to the excitation signals being rectangular waves, the phase encoded signal, designated as "R" in the figures, is a complex rectangular waveform containing angular position information. The phase encoded signal "R" is processed by the low pass filter 48, which produces a decoded sine-wave signal at the test point F. The sine-wave signal is squared in a conventional signal conditioning circuit 50 and is delivered through the capacitor 52 to one input of the latch 60. The squared signal is depicted at test point "P" in the figures.

The latch 60 performs a phase difference to duty cycle conversion, utilizing the decoded phase related signal delivered from the rotor 18, and a phase related reference signal, as input signals. Owing to the fact that the phase information is necessarily related to both of the first and second rectangular-wave excitation signals, the reference signal used can be either of the first and second excitation signals. In the embodiment shown in the figures, the reference signal is taken from the output of the first logic gate 36 and is differentiated by the combination of the capacitor 56 and resistor 58. The result of applying the decoded phase related signal and the selected excitation signal to the input terminals of the latch 60, is that the latch 60 is "set" on the rising edge of the reference signal, and "reset" on the rising edge of the decoded phase related signal, and a duty cycle output signal is delivered at the terminal labelled "OUT". Therefore, the duty factor of the duty cycle output signal is directly related to the angular position of the rotor 16 of the resolver 12.

Representative signal waveforms for 3 different angles of shaft 16 rotation are depicted in FIG. 2. Each set of waveforms shows the relationship between the excitation signals, the induced phase encoded signal, and the resulting duty cycle signal. Exemplary waveforms for angles of rotation other than those depicted can readily be derived from a study of FIG. 2.

The duty cycle output signal can be used in any one of a number of known ways in a digital control system. For example, the duty cycle output signal can be applied directly to an input terminal of a microprocessor, and the time relationship between the "high" and logic "low" logic levels can be determined. Alternatively, the duty cycle output signal can be applied to various hard wired logic circuitry for further processing.

If the circuitry utilized with the apparatus 10 additionally requires an analog signal responsive to the position of the shaft 16, the duty cycle output signal can be low pass filtered to produce a DC signal responsive to the duty factor of the duty cycle output signal. The simplicity of the circuitry required to implement the apparatus 10 makes it advantageous over conventional resolver systems, regardless of the form of output signal ultimately required.

The embodiment of the invention described above provides a duty cycle output signal responsive to the angular position of a shaft 16, utilizing simple and inexpensive digital logic circuitry. The stator coils 20,22 are excited with easily generated and inherently stable rectangular-wave signals, as opposed to the conventional sine-wave excitation signals normally utilized with such resolvers.

Other aspects, objects, advantages, and uses of this invention can be obtained from a study of the drawings, the disclosure, and the appended claims.

I claim:

1. Apparatus for producing an electrical signal having a duty cycle that varies in response to the angular position of a rotatable shaft, comprising:

a resolver having a frame, said shaft being rotatably mounted in said frame, a rotor coil connected to said shaft, and first and second stator coils each having respective first and second stator coil terminals, said stator coils being mounted on said frame and positioned about said rotor coil;

generator means for producing a rectangular-wave timing signal;

a counter having a plurality of coded output terminals, and a count input terminal connected to said generator means;

first and second logic gates, each having respective input terminals connected to predetermined ones of said counter coded output terminals, and output terminals connected to respective ones of said first and second stator coil terminals;

first and second signal inverters, each having an input terminal connected to a respective one of said first and second logic gate output terminals, and an output terminal connected to a respective one of said first and second stator coil terminals;

a low pass filter having an output terminal, and an input terminal connected to said rotor coil;

a signal conditioning circuit having an output terminal, and an input terminal connected to said filter output terminal;

a latch having a first input terminal connected to one of said first and second logic gate output terminals, and a second input terminal connected to said signal conditioning cicuit output terminal; and wherein each of said first and second stator coils includes respective first and second stator coil terminals, one of said first and second stator coil terminals being connected to a respective one of said first and second logic gate output terminals, and the other of said first and second stator coil terminals being connected to a respective one of said first and second signal inverter output terminals.

2. Apparatus for producing an electrical signal having a duty cycle that varies in response to the angular position of a rotatable shaft, comprising:

a resolver having a frame, said shaft being rotatably mounted in said frame, a rotor coil connected to said shaft, and first and second stator coils mounted on said frame and positioned about said rotor coil;

generator means for producing a rectangular-wave timing signal;

logic means for receiving said timing signal, responsively producing first and second rectangular-wave excitation signals, and delivering said first and second excitation signals to respective ones of said first and second stator coils, and wherein said logic means includes a counter, said counter having a plurality of coded output terminals, and a count input terminal connected to said generator means;

decoding means for receiving a phase encoded signal magnetically induced in said rotor coil in response to said first and second rectangular-wave excitation signals, comparing said phase encoded signal with one of said first and second excitation signals, and producing a position signal having a duty cycle responsive to the phase difference between said compared signals;

first and second logic gates each having respective input terminals connected to predetermined ones of said counter coded output terminals, and output terminals connected to respective ones of said first and second stator coils;

first and second signal inverters, each having an input terminal connected to a respective one of said first and second logic gate output terminals, and an output terminal connected to a respective one of said first and second stator coils; and wherein each of said first and second stator coils includes respective first and second stator coil terminals, one of said first and second stator coil terminals being connected to a respective one of said first and second logic gate output terminals, and the other of said first and second stator coil terminals being connected to a respective one of said first and second signal inverter output terminals.

* * * * *